(12) United States Patent
Doci

(10) Patent No.: US 10,249,779 B2
(45) Date of Patent: Apr. 2, 2019

(54) SOLAR COLLECTOR

(71) Applicant: Doci Innovations GmbH, Sieksdorf (DE)

(72) Inventor: Violeta Doci, Hamburg (DE)

(73) Assignees: Violeta Doci, Hamburg (DE); Donata Michelle Doci, Hamburg (DE)

( * ) Notice: Subject to any disclaimer, the term of this patent is extended or adjusted under 35 U.S.C. 154(b) by 0 days.

(21) Appl. No.: 14/426,402

(22) PCT Filed: Sep. 9, 2013

(86) PCT No.: PCT/EP2013/068649
§ 371 (c)(1),
(2) Date: Mar. 6, 2015

(87) PCT Pub. No.: WO2014/037571
PCT Pub. Date: Mar. 13, 2014

(65) Prior Publication Data
US 2015/0325732 A1    Nov. 12, 2015

(30) Foreign Application Priority Data

Sep. 7, 2012 (WO) .................. PCT/IB2012/001743

(51) Int. Cl.
*H01L 31/054* (2014.01)
*H01L 31/052* (2014.01)

(52) U.S. Cl.
CPC ........ *H01L 31/0543* (2014.12); *H01L 31/052* (2013.01); *H01L 31/0521* (2013.01); *H01L 31/0547* (2014.12); *Y02E 10/52* (2013.01)

(58) Field of Classification Search
CPC ............... H01L 31/054; H01L 31/0543; H01L 31/0547; H01L 31/053; H01L 31/0549;
(Continued)

(56) References Cited

U.S. PATENT DOCUMENTS 4,052,228 A    10/1977   Russell
4,418,238 A    11/1983   Lidorenko et al.
(Continued)

FOREIGN PATENT DOCUMENTS

AU    2008207559 A1    5/2009
EP       2515351 A1    10/2012
(Continued)

OTHER PUBLICATIONS

The Engineering Toolbox, "Thermal Conductivity of Materials and Gases", 2006, pp. 1-9.*

(Continued)

*Primary Examiner* — Devina Pillay
*Assistant Examiner* — Daniel P Malley, Jr.
(74) *Attorney, Agent, or Firm* — Drinker Biddle & Reath LLP

(57) ABSTRACT

The present invention relates to a solar collector or a light collector by means of which light, generally sunlight, can be directed onto an energy conversion unit. In particular, it relates to a light collector (10) that has an optical unit (20) and an energy conversion unit, wherein the energy conversion unit is comprised of a number of conversion cells (12, 14, 16) that are located along a first main axis, wherein the optical unit (20) triggers a refraction of light and surrounds the energy conversion unit at least partially, and the optical unit (20) focuses parallel incident light in a focal area, wherein the focal area has its largest dimension along a second main axis and the second main axis extends along the first main axis.

17 Claims, 4 Drawing Sheets

(58) Field of Classification Search
CPC ............... H01L 31/0525; H01L 31/048; H01L 31/0232; H01L 31/0203; H01L 31/055; H01L 35/32; Y02E 10/43; Y02E 10/52; F24J 2/06; F24J 2/08; F24J 2/10; F24J 2/15

See application file for complete search history.

(56) References Cited

U.S. PATENT DOCUMENTS

| | | | |
|---|---|---|---|
| 5,009,243 A | 4/1991 | Barker | |
| 5,123,968 A | 6/1992 | Fraas et al. | |
| 5,125,983 A * | 6/1992 | Cummings | F24J 2/08 136/246 |
| 6,804,062 B2 | 10/2004 | Atwater et al. | |
| 7,160,522 B2 * | 1/2007 | Minano Dominguez | F24J 2/06 126/698 |
| 8,664,514 B2 | 3/2014 | Watters | |
| 2001/0006066 A1 * | 7/2001 | Cherney | F03G 6/003 126/698 |
| 2010/0012186 A1 | 1/2010 | Park et al. | |
| 2010/0132763 A1 * | 6/2010 | Dutta | H01L 31/052 136/246 |
| 2010/0252085 A1 | 10/2010 | Gotthold et al. | |
| 2011/0226307 A1 * | 9/2011 | Liu | H01L 31/0547 136/246 |
| 2012/0037205 A1 * | 2/2012 | Tadayon | H02S 20/30 136/246 |
| 2012/0247534 A1 * | 10/2012 | Nakaya | F24S 23/31 136/246 |

FOREIGN PATENT DOCUMENTS

| | | | | |
|---|---|---|---|---|
| JP | WO 2011074535 A1 * | 6/2011 | ............... | F24J 2/085 |
| WO | WO-2011074535 A1 * | 6/2011 | ......... | H01L 31/0543 |

OTHER PUBLICATIONS

International Search Report for PCT/EP2013/068649 dated Feb. 6, 2014.

* cited by examiner

SOLAR COLLECTOR

CROSS-REFERENCE TO RELATED APPLICATIONS

This application is a national stage application (under 35 U.S.C. § 371) of PCT/EP2013/068649, filed Sep. 9, 2013, which claims benefit of International Application No. PCT/IB2012/001743, filed Sep. 7, 2012, both of which are incorporated herein by reference in their entirety.

FIELD OF THE INVENTION

The present invention relates to a solar collector or light collector by means of which light, generally sunlight, can be directed onto an energy conversion unit. Such an energy conversion unit can include photovoltaic cells, for example.

BACKGROUND INFORMATION

Alternative energy, for example, photovoltaics, plays a rapidly increasing role in the global energy supply. In the area of photovoltaics, intensive research is being conducted that addresses the improvement of the efficiency of solar cells. Some of the insights on which the present invention is based show that even by the way solar cells are used and configured, significant improvements in efficiency can be achieved. But of course, even in this area, various approaches regarding the configuration of energy-producing cells are already available.

Primarily, U.S. Pat. No. 5,123,968 describes a primarily two-layered approach. In a first layer, various solar cells are distributed over an area. In a second layer, respectively centric above the solar cell lenses, Fresnel lenses are provided. Both layers can be connected with each other by an outer housing.

Das U.S. Pat. No. 6,804,062 describes a similar concept which appears more expensive, however, relative to the lenses. There, Fresnel lenses can be combined with conventional lenses.

U.S. patent application No. 2010/0089436 A1 describes a chamber in which optical elements and solar cells can be combined with each other.

The chamber includes a dome-shaped lens, various reflectors and a conventional biconvex lens. Solar cells are provided between these elements. The optical elements attempt—respectively optimally—to focus light on the surface of a dedicated solar cell.

U.S. patent application No. 2010/0012186 A1 discloses a chamber that takes on a shape similar to a light bulb. Light can penetrate through a flat upper side. With the help of the opposite, arched side, this light is refracted and concentrated in the center. A configuration of solar cells is located in this center. Thereby, several solar cells can form a dense stack. Further, the chamber can house the required control electronics.

U.S. patent application No. 2010/0252085 discloses an easily transportable solar system. A large reflector screen is located on a tripod-like stand. This reflector screen concentrates light on a focal point. In this focal point, energy conversion units can be provided. These units are said to be semiconductor elements.

The present invention seeks to provide a light collector that is more compact overall than the collectors known in prior art. At the same time, it is proposed to function at a very high level of efficiency in spite of that. With respect to the efficiency, not only the optical properties must be taken into consideration, thermal dissipation must be good, because light is being concentrated in a small component. Further, the light collector is proposed to be suitable for forming an extensive grid or a type of "mat" in combination with a number of the same light collectors.

These advantages are achieved by a light collector as recited in claim 1.

DETAILED DESCRIPTION OF THE INVENTION

A light collector within the scope of the invention has an optical unit and an energy conversion unit. The energy conversion unit can consist of a number of conversion cells. Thereby, the energy can be converted in various ways. For example, light can be converted into heat. This heat can also be stored by a suitable medium, for example, water. But light can also be converted into electric current. In the latter case, photovoltaic cells (herein also referred to as "solar cells") would be used.

The nature of the conversion cells or, in particular, the solar cells is not especially critical for the present invention. Preferably, these cells are, however, suitable for miniaturization, so that they can be housed easily in a dice having an edge length of one centimeter or less. The conversion cells can be arranged continuously adjacent, but preferably, they are located at a distance to each other. Within the scope of the present invention, it is favorable if the conversion cells extend primarily two-dimensionally; for example, they have the shape of a plate.

The conversion cells are located along a first main axis. Thus the arrangement is proposed to have its primary dimension in one direction and the first main axis extends in the direction of this primary dimension. For example, the configuration of the conversion cells can describe a pillar and the first primary axis it then the longitudinal axis of this pillar.

In the case of a number of conversion cells, two or more, frequently three, four or five conversion cells are present.

The optical unit is proposed to surround the energy conversion unit at least partially. This means that the optical unit surrounds the energy conversion unit at least from an angle of vision of 180 degrees or more. The optical unit can also surround the energy conversion unit completely. This has the effect that the optics for the incidence of light can be utilized well from very different directions. Further, this can also have the effect that the optical unit forms a compact unit together with the energy conversion unit and, if appropriate, mechanically stabilizes the configuration of the energy conversion unit and the individual conversion cells.

The optical unit is proposed to trigger a light refraction. Thereby, the light refraction shall be accomplished in such a way that incident light is focused in a focal area. In contrast to typical optics, light is proposed to be focused not only at one focal point, but on a broad focal area.

The focal area can have an elliptical or nearly elliptical shape in such a way that the focal area is described by a long axis and a short axis. Thereby, it is advantageous when the long axis is more than 20% or 50% or 100% or even 300% longer than the short axis. But it does not need to be longer than 500% of the short axis.

Herein, the long axis is also referred to as the second main axis. Thus, the focal area has its largest expanse along the second main axis. This second main axis is proposed to extend along the first main axis.

It is advantageous when adjacent conversion cells are located at a first identical distance in the direction toward the main axis. If the conversion cells extend essentially two-dimensional in a first plane of extension, it is advantageous when the planes of extension are aligned perpendicular to the first main axis. This has the effect that all conversion cells are aligned in the same way so that a uniform direction results for an optimal incidence of light.

The conversion cells have a characteristic maximum first dimension in the plane of extension. For a conversion cell in the form of a round plate, this first dimension is the diameter of this plate. The maximum dimension for a quadratic conversion cell would be the diagonal of the square. The maximum dimension in the plane of extension is an important dimension in order to determine an appropriate distance between the conversion cells. When the conversion cells are located equidistant having a first distance, this first distance should be at least 30%, preferably 50% or 80% of the first maximum dimension. As a rule, a distance of more than 200% is not required.

Conversion cells that generate electric current are advantageous. Typically, these are photovoltaic elements. As explained, it is advantageous when the conversion cells are located at a distance to each other so that each individual cell can be reached easily by incident light. Especially when the individual cells are very small, it is sufficient when filigree spacers are provided. These can be provided in the form of wires, for example. It is a concept of the present invention to provide a double utilization of such spacers in which these then also function as electric conductors. Then, the spacers can also divert the electric current that is generated.

Thereby, it is advantageous to use several wires, at least two, for mechanical reasons and also for electric control. Three or four wires could also be advantageous. For example, four wires (or general electrically conducting spacers) can be provided at the corners of rectangular conversion cells. In this way, a filigree stack of conversion cells can be built.

It is also advantageous when the optical unit is mounted on a printed circuit board. The cited electrically conducting spacers can then be immediately connected with the printed circuit board. The printed circuit board is used for the electric control of the conversion cells and can also be used to collect and rout the electric current that is generated. Several conversion cells and optical units can also be mounted on a printed circuit board. Alternatively, several light collectors can be connected with each other by means of their printed circuit boards.

It is advantageous when the printed circuit board has a good thermal conductivity. In every case, the thermal conductivity of the printed circuit board should be better than the thermal conductivity of air. It is advantageous when the thermal conductivity at −20 degrees Centigrade—is at least 0.5 watts per meter and Kelvin; values of more than 1, 5, 10 or even 50 watts per meter and Kelvin are better.

A basic problem of a very small light collector unit in which a large amount of light is being concentrated due to an efficient optical unit, is the generation of a substantial amount of heat. The diversion of heat, at least via the printed circuit board, is then a decisive advantage.

It is also advantageous when the optical unit consists of a light-transmitting dish and a fill medium. The light-transmitting dish can consist of glass or Plexiglas, for example, but in general, it can be hard or soft. A film, for example, can also come into consideration. A light-transmitting dish refers to an at least partially light-transmitting dish. Individual areas of the dish can also be opaque.

The dish can be filled with a gaseous or a liquid fill medium. Air as a fill medium is definitely a consideration. Especially in the case of a soft dish, a stable mechanical structure can be achieved thereby, that the dish is filled with a liquid. In general, the dish should be impervious when a liquid is used. At least parts of the dish should prevent leakage of the liquid.

A dish having a flat part and a convex part is advantages. The flat part of the dish can then offer an advantageous plane for mounting the light collector. The convex part can be a part of the optical unit. Thereby, the convex part of the dish can participate in the desired light refraction, i.e. in focusing the incident light onto a focal area expanding in a main direction. Preferably, the convex part of the dish is parabolically arched.

The convex part of the dish can also be metal-coated. This is advantageous in an arrangement in which light falls through the flat part of the dish and the focusing of incident light occurs due to reflection at the inner side of the convex part of the dish.

A very advantageous embodiment of the invention is given then, when the optical unit has a variable index of refraction for the light refraction along the first main axis. In this way, it can be achieved especially easily that light is not focused on one point, but instead over an extended area.

When the light-transmitting dish is filled with a fill medium, the chemical and physical properties of the fill medium can vary in such a way along the main axis that as a result, the index of refraction changes. This is possible then, when the fill medium is a liquid as well as when the fill medium is a gas. Gels also come into consideration as fill media.

In the case of a liquid, the density of the liquid can vary, for example, in order to thus achieve a higher index of refraction in the direction of a higher density of the liquid. It would likewise be a consideration to change the chemical properties of a liquid by mixing it with another substance or by changing it in another way. Within this meaning, it is also a consideration to use two or more liquids or gases and change their mix ratio along a first main axis.

Based on these considerations it follows that it is in principle a concept of the present invention to provide a light collector that has at least a first conversion cell and a second conversion cell that is at a distance from it, whereby a first fill medium is dedicated to the first conversion cell and a fill medium that is different from the first fill medium is dedicated to the second conversion cell. The two fill media can be chemically or physically different. When a fill medium is dedicated to a conversion cell this means that light that reaches the conversion cell is first primarily guided through this fill medium. Thus, the fill medium can be adjacent to the conversion cell or the conversion cell can be contained within this fill medium completely. Thus, in a solar cell, the fill medium would be located above the area exposed to incident light.

When using several conversion cells, even a third or a fourth fill medium can be used, of course. These can likewise be dedicated to individual conversion cells. In the case of suitable media it is a consideration that a certain density gradient is maintained even without mechanical boundaries between the various fill media, for example. However, often it is likely to be advantageous to provide mechanical borders or separating walls. Such separating walls should consist of the same material as the outer dish in order to avoid disadvantageous optical effects. Advantageous materials for the dish are plastics and half crystals. Accordingly, the separating walls can also consist of plastic or half crystals. It is important that in the transition between various fill media, the transition of the index of refraction does not change abruptly causing a significant light reflection.

In the focal area of the optical unit, the light energy is proposed to be higher by a factor of 30 or 50 or even by a factor of 100 or more compared to the incident light. This is accompanied by the challenge already mentioned that the heat that is generated must be dissipated well. In this process, the fill medium can also play a useful role. Accordingly, a fill medium is useful that has a better thermal conductivity than air. The values of thermal conductivities as stated for the printed circuit board are especially advantageous. It is also advantageous when the thermal conductivity of the fill medium is at least 0.5 watt per meter and Kelvin at 20 degrees Centigrade, values of more than 1, 5, 10 or even 50 watts per meter and Kelvin are better.

A useful refinement of the invention consists of equipping at least parts of the outer side of the dish with a coating that suppresses infrared light. Infrared light cannot be converted into energy efficiently, in particular, not by photovoltaic cells. However, infrared light leads to additional heat generation which is problematic in the case of a very compact design of the light collector.

It is a significant advantage of the light collectors according to the invention that they can be easily arranged in a grid or in an energy generation mat. Such an energy generation mat includes a number of light collectors. To the extent a printed circuit board is provided for each light collector, the light collectors can be connected via the corresponding printed circuit boards. The printed circuit boards then form a bearing side that is essentially flat. However, this bearing side can be flexible.

In this way, a mat can be produced that can be applied to the outer skin of a car or an airplane and this can be done even then, when the corresponding outer parts are curved.

The side of such an energy generation mat that faces the sunlight can have a number of convex elements. These convex elements could be additional lenses, but advantageously, these are the convex parts of the light-transmitting dishes of such light collectors.

When the corresponding light generation mat is affixed to the exterior of a car or an airplane, it is exposed to high aerodynamic currents. At the surface, which includes a number of small convex bumps, however, it is very aerodynamically efficient when correspondingly dimensioned. This is an interesting principle of the outer skin of golf balls, for example. In this way, aerodynamic advantages can be achieved that have the additional advantage of focusing light in an optically efficient way.

Further features, but also advantages of the invention result from the drawings that are shown in the following and the pertaining description. In the Figures and in the pertaining descriptions, the features of the invention are described in combination. However, these features can also be included in other combinations by a subject matter according to the invention. Each feature disclosed must also be considered as being disclosed in technically expedient combinations with other features. Parts of the Figures are slightly simplified and schematic.

Figure 3:
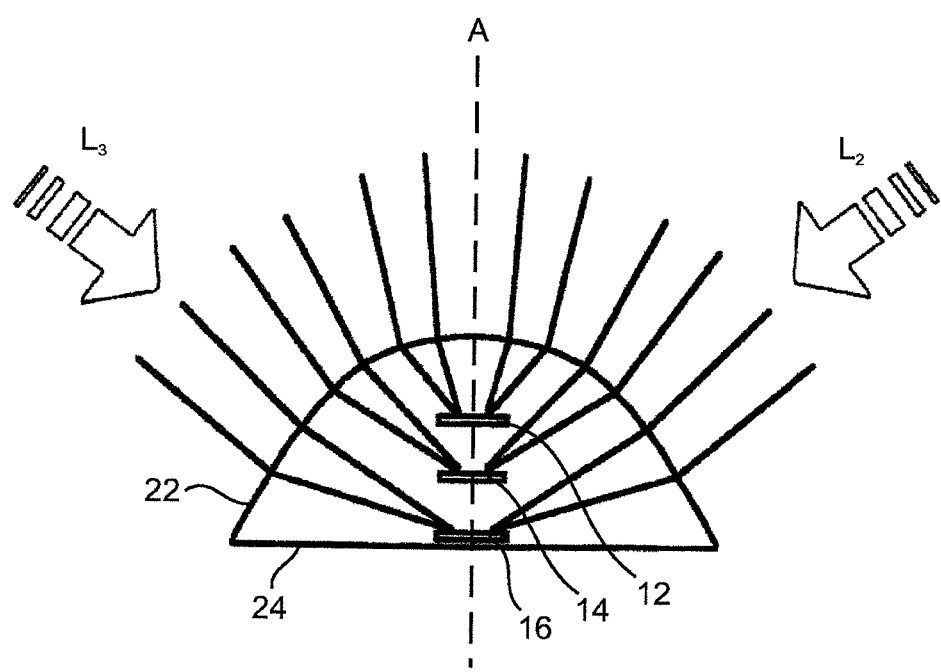

FIG. 3 schematically shows a possible light incidence in such a collector.

Figure 4:
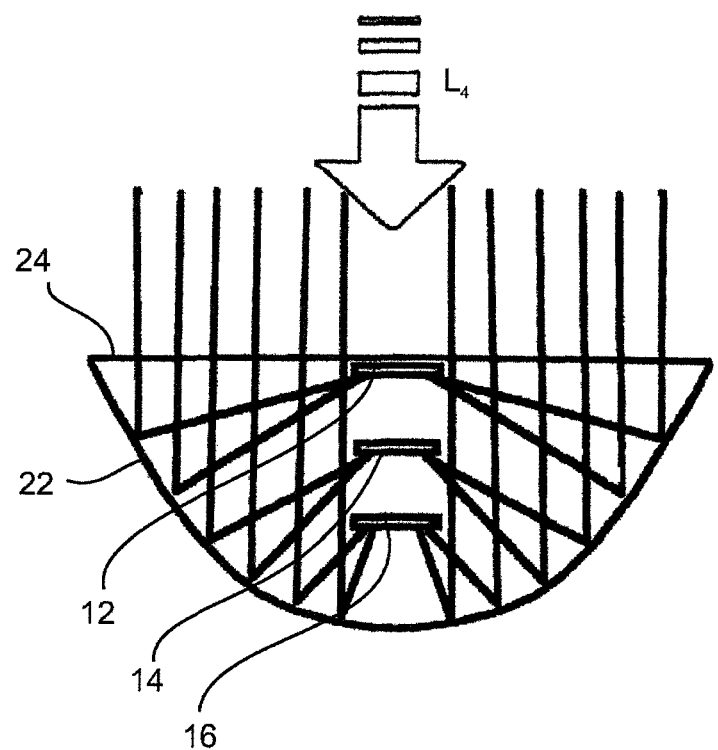

FIG. 4 schematically shows a different embodiment of a light collector with the light incidence.

Figure 1:
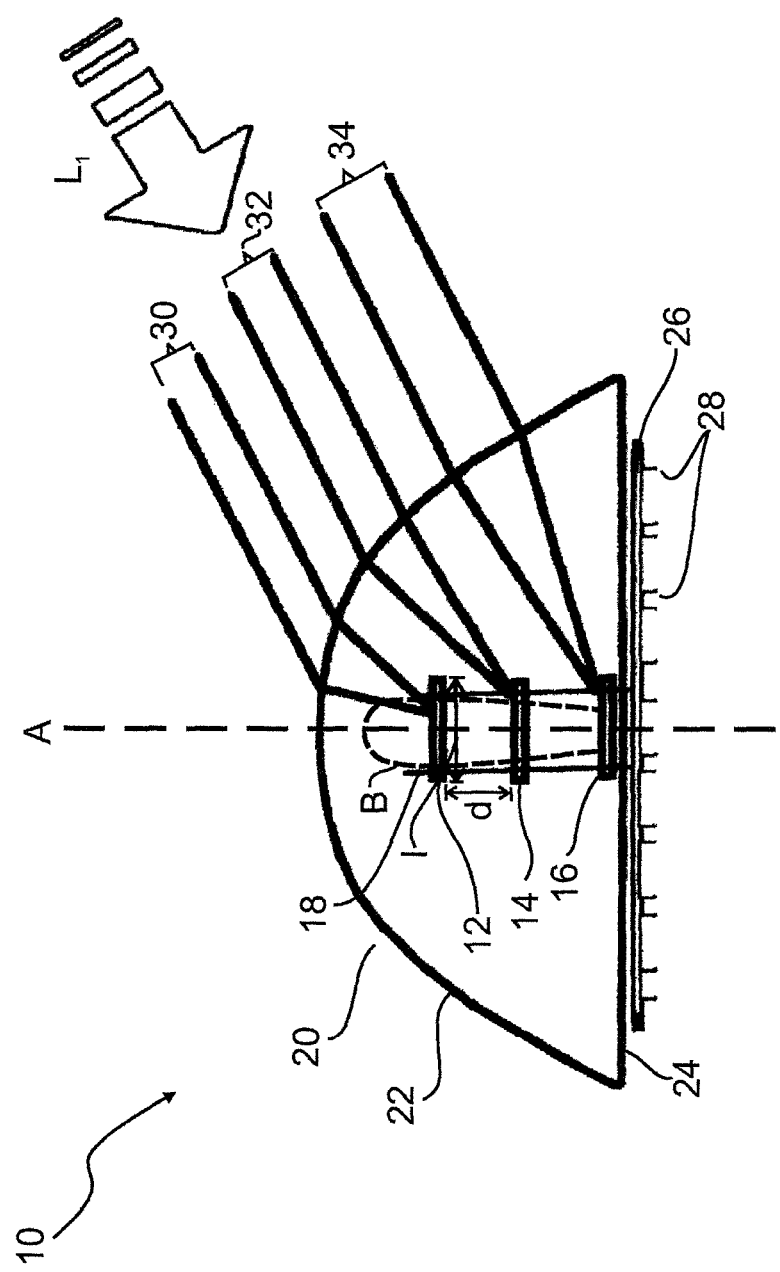
FIG. 1 shows a vertical cross section through a light collector according to the invention.

FIG. 1 shows a vertical cross section of a light collector 10 according to the invention. Light collector 10 has three conversion cells (these can be assumed to be photovoltaic cells, for example), a first conversion cell 12, located underneath a second conversion cell 14 and located underneath a third conversion cell 16. The three conversion cells are connected by spacers 18. Conversion cells 12, 14, 16 are enclosed by an optical unit 20. Optical unit 20 has a dish consisting of an upper convex part 22 and a flat part 24 located underneath such.

Underneath optical unit 20, a printed circuit board 26 is provided. It extends parallel to the flat part 24. It is the carrier element for optical unit 20. Therefore, spacers 18 can be connected with printed circuit board 26 directly. This ensures the mechanical stability of the configuration and can additionally be used to discharge electric current. Printed circuit board 26 has pins 28. By means of these pins 28, it can be connected with adjacent light collectors 10 or with other units. Pins 28 can also be used for a mechanical connection of printed circuit board 26 with other elements.

It can also be seen easily that conversion cells 12, 14 and 16 form a type of stack. This stack has its primary dimension along a first main axis A. The conversion cells extend in parallel planes perpendicular to this main axis A. Each conversion cell has a certain maximum dimension l on this plane of extension. The corresponding maximum dimension l is illustrated for first conversion cell 12. Further, the conversion cells have an advantageous distance to each other that is illustrated as distance d between the first conversion cell 12 and the second conversion cell 14. It can be seen that the distance d is selected to be sufficiently large in order to ensure a sufficient light incidence for each individual conversion cell while taking dimension l into consideration.

The progression of the light incidence is shown relative to the first direction of light incidence $L_1$. From this direction of light incidence $L_1$, parallel rays must reach to light collector 10. These are shown as a first pair of rays 30, a second pair of rays 32 and a third pair of rays 34. As can be seen, optical unit 20 is configured in such a way that even the rays are focused precisely parallel to the incidence of light, and are not focused onto one focal point. Rather, a series of focal points is used that jointly form focal area B. This focal area B extends along the [a] the longest axis that coincides with the first main axis A. As can be seen, the light of the first pair of rays 30 is primarily focused on the first conversion cell 12. In contrast, the light of the second pair of rays 32 is focused primarily on the second conversion cell 14, and the light of the third pair of rays 34 is primarily focused on the third conversion cell 16. In this way, all conversion cells can achieve approximately the same energy output. Moreover, thermal problems that occur when all of the light is focused on an area that is too narrow or on a single focal point, are also avoided.

Figure 2:
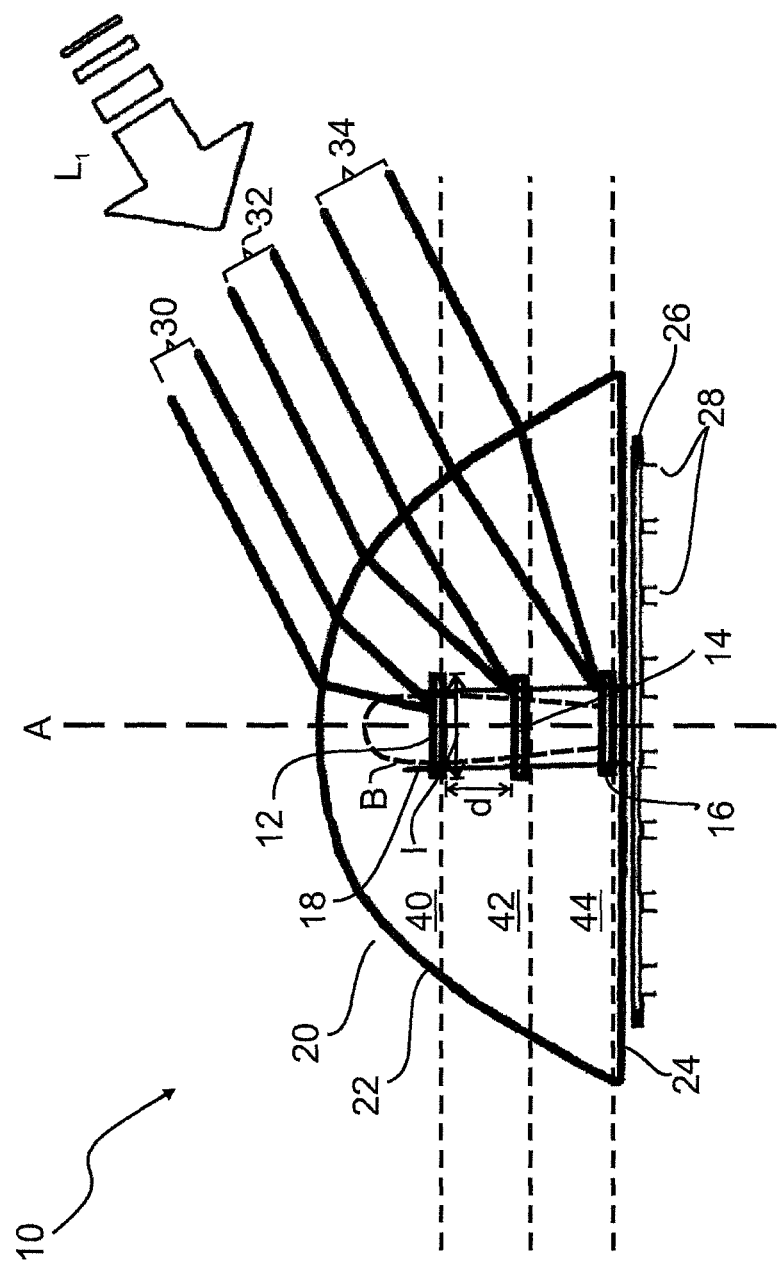
FIG. 2 shows a vertical cross section through a light collector in a different embodiment.

FIG. 2 represents a different embodiment of light collector 10. The basic elements of the energy conversion units consisting of the conversion cells and the mechanical elements are identical. However, in the interior of the dish of the optical unit, a more complex structure is provided. In this embodiment, various fill media must be in the interior of the dish, namely, a first fill medium 40 in the upper area, below it, a second fill medium 42 and below it, adjacent to the flat part of dish 24, a third fill medium 44. These fill media must have a different index of refraction respectively. In this way, the fill media can support efficient light refraction together with the outer shape of the dish. As a result refraction is efficiently achieved in an extensive focal area B.

As can be seen, the first fill medium 40 is dedicated to the first conversion cell 12, i.e. it is located essentially above the conversion cell in the direction of the incident light. Correspondingly, the second fill medium is dedicated to the second conversion cell 14, and the third fill medium 44 to the third conversion cell 16. The boundaries between the fill media are shown as dotted lines. It is a definite consideration to provide solid separating walls at these boundaries. These separating walls can consist of the same material as the dish and be integrally joined to the convex part 22 of the dish. The separating walls can also consist of a material that is different than the dish. They can be connected with the dish firmly or detachable.

FIG. 3 is a schematically slightly simplified illustration of a light collector that has the basic structure of the light collector in FIG. 1 or FIG. 2. In this schematic representation, only the outer dish is shown with its convex part 22 and its flat part 24, as well as the three conversion cells. The light incidence is shown from two main directions, the direction of light incidence $L_2$ and the direction of light incidence $L_3$. It can be seen that even incident light that is not parallel is focused well onto the various conversion cells as a result of the optics provided. Further, it can be seen how advantageous it is to have the rotation-symmetric configuration around the first main axis A. Light coming from all direction around this axis is captured equally well. By means of a rough alignment of the light collector it is therefore possible over the course of a day to achieve an almost uniformly good light output at variable positions of the sun. In general, this rotation-symmetry represents an important advantage of the optical configuration according to the invention.

FIG. 4 schematically illustrates a different optical configuration. Here, three conversion elements 12, 14 and 16 are once again provided which are enclosed by an optical element. The optical element in turn has a convex part 22 and a flat part 24 of the dish. In this case, however, the convex part of the dish does not serve as a lens, but as a focusing mirror. Parallel to the direction of incidence of light $L_4$, incident light falls through the flat part of the dish into the interior of the optical element. It is reflected at convex part 22 of the dish. Once again, the light is not focused on a point but on all three conversion cells with good output.

With the aid of the above general description and the more detailed description of the individual Figures it has become clear how, based on the present invention, mechanically, thermally and optically optimized light collectors can be provided which can even be advantageously combined to form a mat.

REFERENCE NUMBERS

10 Light collector
12 First conversion cell
14 Second conversion cell
16 Third conversion cell
18 Spacer
20 Optical unit
22 Convex part of the dish
24 Flat part of the dish
26 Printed circuit board
28 Pins
30 First pair of rays
32 Second pair of rays
34 Third pair of rays
36 (not used)
38 (not used)
40 First fill medium
42 Second fill medium
44 Third fill medium
A First main axis
B Focal area
l Dimension
d Distance
$L_1$ Direction of light incidence
$L_2$ Direction of light incidence
$L_3$ Direction of light incidence
$L_4$ Direction of light incidence

What is claimed is:

1. A light collector (10) having an optical unit (20) and an energy conversion unit, whereby the energy conversion unit comprises a number of conversion cells (12, 14, 16) that are located along a first main axis, in which the optical unit (20) triggers a light refraction and encloses the energy conversion unit by at least 180 degrees, and the optical unit (20) focuses parallel incident light on a focal area,
   wherein the focal area has its largest dimension along a second main axis, and the second main axis extends along the first main axis, the optical unit (20) comprises a light-transmitting dish and a fill medium, and the optical unit (20) has a variable index of refraction along the first main axis for the refraction of light, the conversion cells comprising a first conversion cell (12) at a distance from a second conversion cell (14), the first conversion cell (12) being dedicated to a first fill medium and the second conversion cell (14) being dedicated to a fill medium (42) that is different from the first fill medium (40), the dish having an upper part (22) and an underneath part (24), the energy conversion unit being located within the upper part (22) of the dish, the optical unit (20) being supported by a carrier element (26) below the underneath part (24) of the dish, the conversion cells (12,14,16) generating electric current and being connected together and spaced apart by spacers (18), and the spacers (18) being electrically conductive.

2. A light collector (10) as recited in claim 1,
   wherein the conversion cells (12, 14, 16) are located at a distance from each other and essentially extend two-dimensionally and have a first maximum dimension in the plane of the extension.

3. A light collector (10) as recited in claim 1,
   wherein the planes of extension are oriented perpendicular to the main axis and the adjacent conversion cells (12, 14, 16) have the same first distance to each other in the direction toward the main axis.

4. A light collector (10) as recited in claim 3,
   in which the conversion cells (12, 14, 16) extend essentially two-dimensionally and have a maximum dimension in the plane of extension and
   wherein the first distance is at least 30% of the maximum dimension.

5. A light collector (10) as recited in claim 1,
   wherein the optical unit (20) surrounds the energy conversion unit completely.

6. A light collector (10) as recited in claim 1,
   wherein the fill medium comprises at least one gas or at least one liquid.

7. A light collector (10) as recited in claim 6,
   wherein the physical properties of the at least one gas or the at least one liquid along the first main axis vary in such a way that a change in the index of refraction is triggered thereby.

8. An energy generation mat comprising a number of light collectors (10) as recited in claim 1, wherein the mat has a bearing side that is essentially flat and a side that faces the sunlight that comprises a number of convex elements each of which is a component of a respective optical unit of the light collectors (10).

9. A light collector (10) as recited in claim 1, wherein the conversion cells (12, 14, 16) are located at a distance from each other and essentially extend two-dimensionally and have a first maximum dimension in the plane of the extension, wherein the carrier element (26) is a printed circuit board, wherein the optical unit (20) surrounds the energy conversion unit completely, wherein the upper part (22) of the light-transmitting dish is arched, wherein the fill medium comprises at least one gas or at least one liquid, wherein the optical unit (20) has a variable index of refraction along the first main axis for the refraction of light, and wherein the physical properties of the at least one gas or the at least one liquid along the first main axis vary in such a way that a change in the index of refraction is triggered thereby.

10. A light collector (10) as recited in claim 4, wherein the distance is at least 50% of the maximum distance.

11. A light collector (10) as recited in claim 1, wherein the carrier element (26) is a printed circuit board, and the spacers (18) being wires directly connected with the printed circuit board (26).

12. A light collector (10) as recited in claim 11, wherein the printed circuit board (26) has pins (28) for connection to other elements, the underneath part (24) being flat, and the printed circuit board (26) being parallel to the underneath part (24).

13. A light collector (10) as recited in claim 1, wherein the fill mediums (40,42) are separated from each other by separating walls made from the same material as the dish (22).

14. A light collector (10) as recited in claim 1, wherein the upper part (22) of the dish is metal coated.

15. A light collector (10) as recited in claim 1, wherein the dish (22) has a coating on its outer side that suppresses infrared light.

16. A light collector (10) as recited in claim 1, wherein the upper part (22) of the dish has a convex shape, and the underneath part (24) of the dish is flat.

17. A light collector (10) as recited in claim 16, wherein the convex shape of the upper part (22) is a parabolic arch.

\* \* \* \* \*